United States Patent [19]

Wheatley, Jr.

[11] 4,004,242
[45] Jan. 18, 1977

[54] APPARATUS FOR SUPPLYING SYMMETRICALLY LIMITED BIDIRECTIONAL SIGNAL CURRENTS

[75] Inventor: Carl Franklin Wheatley, Jr., Somerset, N.J.

[73] Assignee: RCA Corporation, New York, N.Y.

[22] Filed: Feb. 27, 1975

[21] Appl. No.: 553,635

Related U.S. Application Data

[62] Division of Ser. No. 363,600, May 24, 1973, abandoned.

[52] U.S. Cl. .......................... 330/22; 307/235 A; 307/237; 330/17; 330/30 D
[51] Int. Cl.² .......................................... H03F 3/45
[58] Field of Search ......... 307/235 A, 237; 330/19, 330/22, 30 D, 17

[56] References Cited

UNITED STATES PATENTS

| 3,648,071 | 3/1972 | Mrazek ............................ 307/237 |
| 3,666,970 | 5/1972 | Abbott et al. ..................... 307/237 |
| 3,721,835 | 3/1973 | Hess ................................ 307/237 |

*Primary Examiner*—R. V. Rolinec
*Assistant Examiner*—Lawrence J. Dahl
*Attorney, Agent, or Firm*—H. Christoffersen; S. Cohen; A. L. R. Limberg

[57] ABSTRACT

An input signal current is superimposed on a direct current. The resultant unidirectional composite signal is symmetrically peak-limited or clipped. Thereafter, the direct current component is extracted to leave a bidirectional signal current which has symmetrically limited peaks and substantially no direct component.

12 Claims, 4 Drawing Figures

APPARATUS FOR SUPPLYING SYMMETRICALLY LIMITED BIDIRECTIONAL SIGNAL CURRENTS

This application is a divisional application based on my U.S. patent application Ser. No. 363,600, filed May 24, 1973, and entitled "AMPLIFIER WITH OVERCURRENT PROTECTION", now abandoned.

BACKGROUND OF THE INVENTION

The present invention relates to apparatus for supplying symmetrically limited bidirectional currents.

Apparatus for symmetrically limiting the positive and negative excursions of bidirectional signal potential swings—such as, for example, back-to-back diode configuration—are well known in the art. Transistor circuitry commonly deals with signals as expressed in current rather than voltage terms, and so the need for apparatus providing bidirectional currents with symmetrically limited positive and negative excursions has come to be felt.

A particular need for such apparatus occurs in the design of quasi-linear audio power amplifiers using pairs of Class B amplifiers in push-pull for supplying output signal currents to loudspeaker loads. These amplifiers are used in systems for reproducing music. Music tends to have high peak-to-average energy content so some clipping of signal peaks during loud passages of the music occurs, particularly where (as in the case with monolithic integrated circuit amplifiers) the electrical power output available from the amplifier is only a few watts. The clipping of the positive and negative peaks of the music must be carried out symmetrically or the distortion introduced by the clipping of peaks is intolerably offensive to the ear.

The phenomena which tend to limit increases in current level in conventional amplifier circuits are primarily associated with unidirectional current flow. For example, the limitations upon collector current variation in a common-emitter transistor amplifier with resistive collector load, which limitations are imposed by cut-off and saturation of the transistor, are imposed for the same direction of collector current flow. But audio power amplifiers conventionally are connected to their loads so as to avoid direct current flow to the load, and so output currents between amplifier and load flow in each of the two possible directions at different points in time. The flow of substantial direct currents in the output stages of the amplifier is studiously avoided since this undesirably increases standby power dissipation in the amplifier. (Indeed, the desire for low standby power dissipation is the underlying reason for Class B operation of the output amplifier stages.) So, the problem is to provide the output stages of the audio power amplifier with signal currents with no accompanying direct current component and with symmetrical limiting of their positive and negative excursions.

The problem becomes yet more complex where it is desired to vary the levels at which clipping of the signal peaks occur responsive to certain operating parameters of the amplifier—for example, to the temperature of its output transistors. As the output power the amplifier is called upon to deliver to its load increases, the internal heating of the transistors in the output stage may exceed the capability for dissipating the heat from them. Accordingly, the temperatures of the output transistors tend to rise. If these temperature rises are left unchecked, they result in injury or destruction to the transistors. A way of reducing the likelihood of unacceptable temperature rise is to reduce the excursions of input signal to the output transistors when they tend to overheat.

The present invention is embodied within apparatus comprising means for supplying an a-c signal current superimposed on a direct current component to form a composite signal current means for limiting excursions of the composite signal current from the direct current component to keep them from exceeding a predetermined amount in either direction of current swing, and means for combining another direct current component with limited composite signal current to obtain a symmetrically-limited bidirectional output signal current with no direct component.

DETAILED DESCRIPTION

Figure 1:
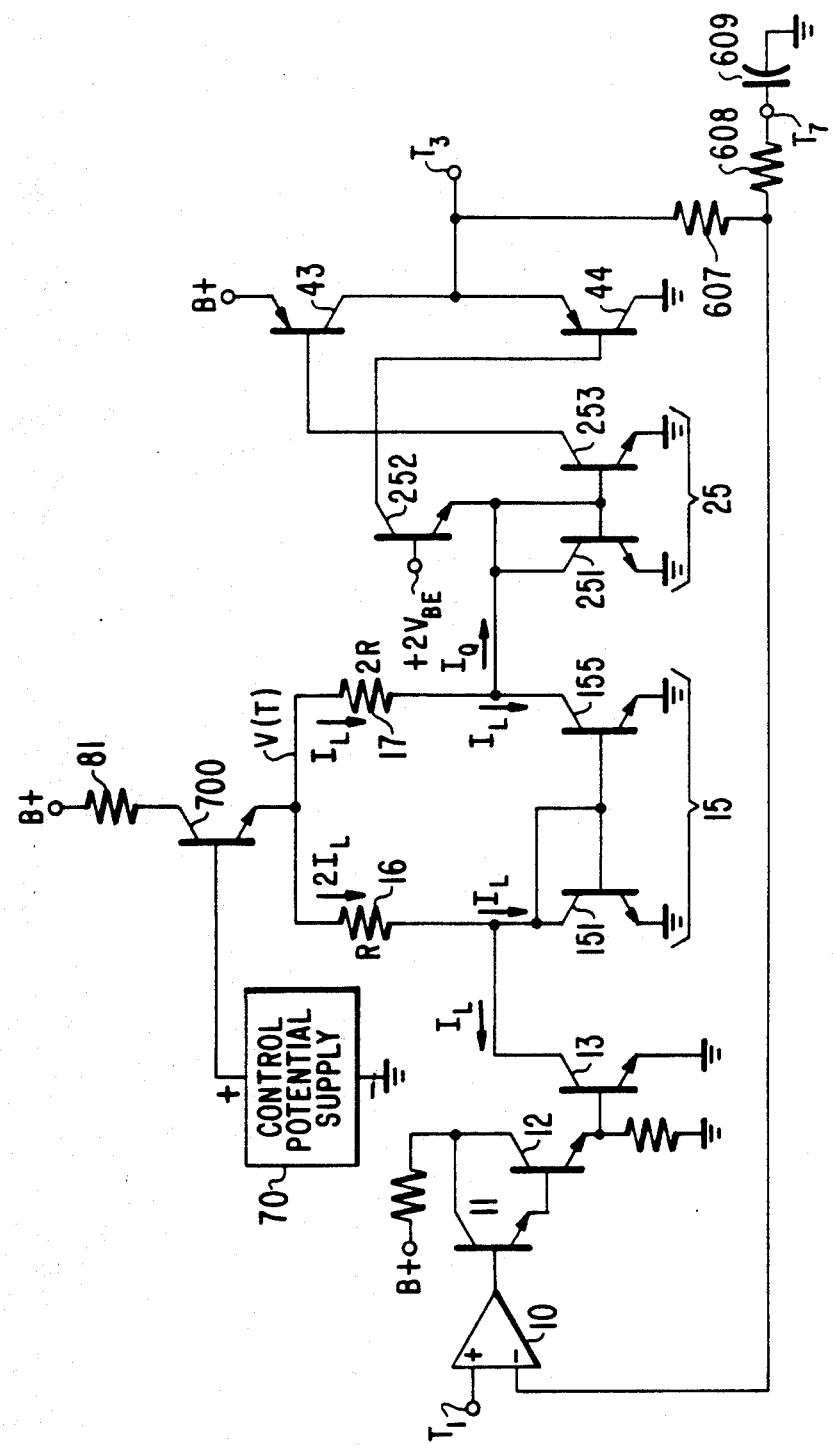
FIG. 1 is a schematic diagram, partially in block form, of an amplifier including a current limiting apparatus embodying the present invention.

The FIG. 1 power amplifier responds to an input signal applied to terminal $T_1$ to supply an output signal current at $T_3$ to a load (not shown). The amplifier has overall direct-coupled feedback. The input signal applied to terminal $T_1$ is applied to the non-inverting input circuit of a differential-input amplifier 10, the inverting input circuit of which receives the overall direct-coupled feedback signal. Amplifier 10 compares the signals applied to its input circuits, and provides error signal proportional to their difference between them which is then amplified by the cascaded common collector amplifiers 11 and 12. This amplified error signal comprises an a-c signal component superimposed on a direct current component and this composite signal is applied as base current to grounded-emitter amplifier transistor 13.

The common-emitter amplifier action of transistor 13 provides a collector current only in response to the positive portions of the composite signal current applied to its base electrode. This partially limited collector current response is applied to limiting circuitry 15, which responds to provide a symmetrically limited output current $I_Q$ with essentially no direct component to a phase-splitting amplifier 25. Phase-splitting amplifier 25 is of the type described in my U.S. Pat. No. 3,573,645 issued Apr. 6, 1971 and entitled "PHASE-SPLITTING AMPLIFIER." Phase-splitting amplifier 25 responds to negative excursions of $I_Q$ with the common-base amplifier action of transistor 252 acting to demand from transistor 44 base current proportionally related to those negative excursions. Phase-splitting amplifier 25 responds to positive excursions of $I_Q$ with the current-mirror amplifier action of transistors 251 and 253 acting to demand from transistor 43 base current proportionally related to those positive excursions. Accordingly, transistors 43 and 44 are operated in Class B push-pull to provide, at terminal $T_3$, quasi-linear response to $I_Q$.

Terminal $T_3$ has a direct-coupled overall feedback connection to differential input amplifier 10 through resistor 607. The effect of this feedback is reduced for a-c signals by means of low-pass filtering, as provided by resistor 608 and capacitor 609 operating in conjunction with resistor 607 as a potential divider for a-c signal.

This direct-coupled overall feedback maintains the quiescent current $I_Q$ flowing in the input circuit of the phase-splitting amplifier 25 substantially zero-valued. It is important to understand why this is so before proceeding to describe how the limiting circuitry 15 works.

The base-emitter junctions of transistors 251, 252 and 253 are all made alike so their current versus base-emitter potential characteristics are alike. The $+2V_{BE}$ potential at the base electrode of transistor 252 is a potential equal to twice the base-emitter offset potential of a transistor operated at very low current levels. When $I_Q$ is zero-valued, this low $2V_{BE}$ offset potential is divided substantially equally between the base-emitter junctions of transistors 252 and of self-biased transistor 251 for the following reasons.

The base current of transistor 253 is negligibly small compared to the combined base and collector currents or emitter current of transistor 251, so when $I_Q$ is zero, the emitter currents of transistors 251 and 252 are substantially equal. The emitter resistance of any transistor such as 252 is inversely proportional to its transconductance $g_m$ and thus to its emitter current level. The combined collector and base resistances of a self-biased transistor, such as 251, is equal to its emitter resistance. The emitter resistance of 252 being equal to the resistance of the self-biased transistor 251 causes equal division of the $+2V_{BE}$ potential between them when $I_Q$ is zero. The low-valued $+1V_{BE}$ quiescent potentials appearing across the base-emitter junctions of transistors 252 and 253 due to this potential divider action condition them for substantially equal very low quiescent collector current levels.

The very low quiescent collector current of transistor 252 is demanded as base current from transistor 44, and the very low quiescent collector current demand of transistor 253 is demanded as base current from transistor 43. Transistors 43 and 44 respond to the similar very low quiescent base current demands imposed upon them to conduct an idling current from B+ operating potential to ground reference potential through their serially connected emitter-to-collector paths. Any pronounced dissimilarity between the collector current of transistor 43 and emitter current of transistor 44 will give rise to an overall feedback current coupled back to the inverting input circuit of the differential-input amplifier 10. This feedback circuit alters the error signal upon which $I_Q$ depends to reduce the dissimilarity between its collector current of transistor 43 and emitter current of transistor 44. Since this dissimilarity should be expected to be at least an order of magnitude smaller than the idling current itself and since the idling current is typically a couple of orders of magnitude less than the peak currents in transistors 43 and 44, the value of $I_Q$ required to exert the correction just described is small as compared to its expected range of variation during periods when full input signals are applied to $T_1$.

Knowing that the quiescent value of $I_Q$ is substantially zero permits analysis of the quiescent current conditions in the limiting circuitry 15. A control potential provided by a control potential supply 70 to the base electrode of transistor 700 establishes a potential $V(T)$ at the emitter electrode of transistor 700 by emitter-follower action. When $I_Q$ is substantially zero, the input potential of phase-splitting amplifier 25 is $+1V_{BE}$, as noted above. So, by Ohm's Law, the quiescent current $I_L$ flowing through resistor 17 is the potential drop thereacross $[V(T) - 1V_{BE}]$ divided by the resistance $2R$ of resistor 17. With the current flow $I_L$ flowing down through resistor 17, in order that the quiescent value of $I_Q$ be substantially zero, the quiescent collector current of transistor 155 must be substantially equal to $I_L$.

Now, transistors 151 and 155 are connected in current mirror amplifier configuration with each other. Their base-emitter junctions are connected in parallel and, assuming the transistors to have similar base-emitter junctions, their collector currents are therefore substantially equal. The collector-to-base feedback connection of the self-biased transistor 151 conditions it to accept as collector current all of any current applied thereto except for the usually negligible portions flowing as base currents to transistors 151 and 155. This feedback connection also stabilizes the emitter-to-collector potential of transistor 151 to a $+1V_{BE}$ value.

Therefore, resistor 16 must have a potential drop thereacross equal to $[V(T) - 1V_{BE}]$. The resistance of resistor 16 is chosen to have a value of R. The resistance is half that of resistor 17, but the potential drops across resistors 16 and 17 are the same; therefore, by Ohm's Law, the quiescent current flow through resistor 16 must be twice as large as that through resistor 17. But only substantially half this quiescent $2I_L$ current flow through resistor 16 can be accepted as collector current by transistor 151. Were its collector current larger than $I_L$, the collector current of transistor 155 would be correspondingly larger and exceed the $I_L$ current flow through resistor 17; this would result in a pronounced quiescent $I_Q$ input current demand from the phase-splitting amplifier 25, and the overall feedback loop prevents this condition from occurring. The half of the $2I_L$ current flow through resistor 16 which is not accepted as collector current by transistor 151 because of the action of the overall feedback loop, must therefore flow as quiescent collector current to transistor 13.

By using resistors 16 and 17 with $[V(T) - 1V_{BE}]$ potentials across them for applying direct currents, the levels of the $2I_L$ and $I_L$ currents can be easily adjusted by changing the value of $V(T)$; and the overall feedback loop will adjust the quiescent collector current of transistor 13 to suit. The primary reason for using these resistors instead of the collector currents of PNP transistors as current sources is that it may be convenient as shown in connection with the FIG. 1 amplifier to develop a potential referred to B+ which is proportional to $[V(T) - 1V_{BE}]$. Such a potential can be developed across the collector resistor 81 of transistor 700 by common-emitter amplifier action.

With the quiescent bias conditions of limiting circuitry 15 known, the behavior of the circuit when input signals are applied to terminal $T_1$ can be analyzed. Cascaded amplifiers 10, 11, 12 respond to negative swings of the input signal applied to $T_1$ to supply decreased base current to transistor 13. Transistor 13 responds to demand a lesser portion of the direct current $2I_L$ flowing through resistor 16, and the current available as collector current to transistor 151 is commensurately increased. The current mirror amplifier action of transistors 151, 155 causes the collector current demand of transistor 155 to be increased in like measure. The excess of the collector current demand of transistor 155 over the $I_L$ current available through resistor 17 must be met by current withdrawn from the input circuit of phase-splitting amplifier 25. This results in an increase in the conduction of transistor 252. There is a concomitant increase in the potential offset across the base-emitter junction of transistor 252. This forces a reduction in the base-emitter potentials of transistors 251 and 253 and biases these transistors past cut-off and into non-conduction. The common-base amplifier action of transistor 252 transfers the excess of collector current demand over $I_L$ which transistor 155 presents to the emitter electrode of transistor 252, and places it substantially entirely on the base electrode of transistor 44.

In this phase of operation, the collector current variation of transistor 13 is amplified in turn by minus unity due to the current mirror amplifier action of transistors 151 and 155 and then by unity due to the common-base amplifier action of transistor 252. So, the base current of transistor 44 is substantially equal in amplitude and opposite in polarity to the collector current variation of transistor 13 when that collector current variation is negative in sense. Accordingly, transistor 44 demands from terminal $T_3$ and the load (not shown) a current proportional to the amplitude of the negative excursions of input signal applied to terminal $T_1$. (Transistor 43 is non-conductive, there being no base current extracted from it, since transistor 253 is cut-off and exerts no collector current demand upon the base electrode of transistor 43.)

Transistor 13 is only unilaterally responsive to current applied to its base electrode, and when its collector current demand is reduced to zero, it will not respond to further negative swing of input signal to supply collector current. When transistor 13 is cut-off the current available as collector current to transistor 151 will be at a maximum, which is to say, the complete $2I_L$ current flow through resistor 16. The collector current demand of transistor 155 will, by the current mirror amplifier action of transistors 151 and 155, be $2I_L$ as well. This $2I_L$ demand will be incompletely satisfied by the $I_L$ current available through resistor 17, and the $I_L$ excess of demand will be transferred to the base electrode of transistor 44 and amplified by the common-collector forward current gain $(\beta_{44}+1)$ of transistor 44 to demand a current $(\beta_{44} + 1)I_L$ from the load (not shown) connected to terminal $T_3$.

Cascaded amplifiers 10, 11 and 12 respond to positive swings of the input signal applied to $T_1$ to supply increased base current to transistor 13. Transistor 13 responds to demand a larger portion of the direct current $2I_L$ flowing through resistor 16 and the current available to transistor 151 as collector current is commensurately reduced. The current mirror amplifier action of transistors 151, 155 causes the collector current demand of transistor 155 to be reduced in like measure. The excess of the $I_L$ current flowing through resistor 17 over the collector current demand of transistor 155 flows as a positive input current into the current-splitting amplifier 25, cutting off conduction in transistor 252 and increasing conduction in transistors 251 and 253. The increased collector current demand of transistor 253 places increased base current demand on transistor 43.

In this phase of operation, the collector current variation of transistor 13 is amplified in turn by minus unity due to the current mirror amplifier action of transistors 151 and 155 and by minus unity due to the current mirror amplifier action of transistors 251 and 253. So the base current variation of transistor 43 is substantially equal in amplitude and similar in polarity, to the collector current variation of transistor 13 when that collector current variation is positive in sense. Accordingly, transistor 43 supplies to terminal $T_3$ and the load (not shown) a current proportional to the amplitude of the positive excursions of the input signal applied to terminal $T_1$. (Transistor 44 is non-conductive, there being no base current extracted from it when transistor 252 is non-conductive.)

Now, as the collector current of transistor 13 reaches the level $2I_L$, the current flow $2I_L$ through resistor 16 is diverted entirely to the collector electrode of transistor 13 and no portion of it is available as collector current of transistor 151. So transistor 13 saturates, and the potential at the base electrodes of transistors 151 and 152 falls below that required to maintain these transistors in conduction. The $I_L$ current flow through resistor 17, by virtue of transistor 155 being cut off from conduction, is applied in full measure to the input circuit of phase-splitting amplifier 25. This $I_L$ current flow will be inverted by the current mirror amplifier action of transistors 251 and 253 to demand a current $I_L$ from the base electrode of transistor 43. This $I_L$ base current demand is amplified by the common-emitter current gain $\beta_{43}$ of transistor 43 to supply a current $\beta_{43} I_L$ to the load (not shown) connected to terminal $T_3$.

Where $\beta_{43}$ and $\beta_{44}$ are substantially equal and substantially larger than unity, the amplifier output signal current to its load is symmetrically limited. The input current to phase-splitting amplifier 25 is symmetrically limited ranging over a gamut from $-I_L$ to $I_L$ and having a quiescent value substantially equal to zero.

The development of the symmetrically limited bidirectional signal current for application to phase-splitter 25 can thus be seen to proceed as follows. The direct-coupled cascaded amplifiers 10, 11, 12 provide a composite signal comprising current variations superimposed on a direct current component. Cut-off of common-emitter amplifier transistor 13 provides clipping of the composite signal in one sense of swing; and cut-off of the current mirror amplifier comprising transistors 151 and 155 provides clipping in the other sense of swing. These clipping procedures are carried out on unidirectional flows of current. The direct current component is subtracted out by the countervailing flow of direct current through resistor 17 to obtain a bidirectional, symmetrical limited current applied to phase-splitting amplifier 25.

Figure 2:
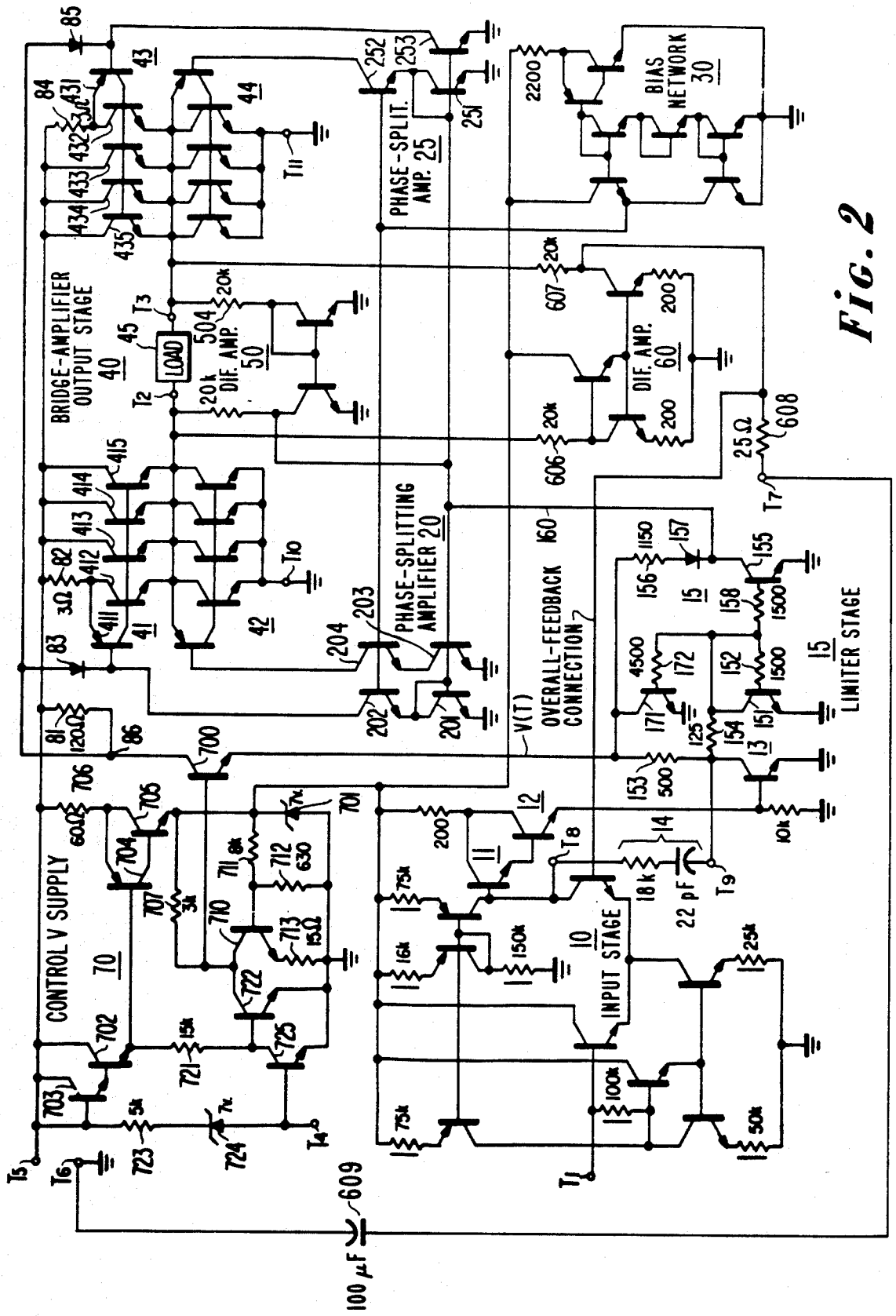
FIG. 2 is a full schematic diagram of an amplifier incorporating a current limiting apparatus of the type shown in FIG. 1.

FIG. 2 is a schematic diagram of a bridge-output amplifier designed to be constructed in monolithic-integrated circuit form. The load 45 (which is typically a loudspeaker), the RC series combination linking terminals $T_8$ and $T_9$ and the bypass capacitor connected between terminals $T_6$ and $T_7$, are external, off-die components. Resistor symbols which have a bar adjacent to them denote resistors which are preferably fabricated as pinch resistors. Resistors 82 and 84, each shown as being 3 ohms in resistance, preferably are fabricated in the same N+ diffusion process used to provide buried layers or "pockets" in the collector regions of the NPN transistors. This avoids having to make ohmic contact to the ends of the resistors 82 and 84 connected to the collector electrodes of transistors 412 and 432, respectively. Resistor 81 should have a resistance tracking that of resistors 82 and 84, so it too is made as a buried layer resistor. Other resistors less than 200 ohms may be made by N+ diffusions at the same time as NPN transistor emitter regions are diffused. All other resistors may be made by P diffusions at the same time as the NPN transistor base regions are diffused. The NPN transistors are most feasibly realized by vertical structures, and the PNP transistors by lateral structures.

The output transistors 41, 42, 43, 44 as shown are each a composite PNP transistor comprising an input PNP transistor, the base electrode of which forms the effective "base" electrode of the composite transistor, and a plurality of parallelly connected NPN output transistors, the joined emitter electrodes of which form the effective "collector" electrode of the compoiste transistor. The effective "emitter" electrode of the composite transistor is the point to which the emitter of the input PNP transistor and the collector electrodes of the NPN output transistors are connected. The collector electrode of the PNP transistor is coupled to the base electrode of the NPN output transistors. Each composite transistor (41, 42, 43, 44) behaves as a PNP transistor having an effective beta substantially equal to the beta of its input PNP transistor times the beta of one of its output NPN transistors times the beta of one of its output NPN transistors (presuming the betas of the NPN component transistors to be equal). The effective base, emitter and collector electrodes of the composite transistor will be referred to as "base", "emitter" and "collector" electrodes, respectively, throughout this application. A composite transistor is used in integrated circuitry to realize a PNP transistor since the NPN component transistor being realized in vertical structure are more economical of area on the integrated-circuit chip and tend to have higher beta than PNP transistors, which are realized in a lateral structure.

A specific structure is shown for differential-input amplifier 10 in FIG. 2. Common-collector amplifier transistors 11 and 12 perform as in the FIG. 1 amplifier, and the operation of common-emitter amplifier transistor 13 is substantially as in the FIG. 1 amplifier. The limiting circuitry 15' has been modified somewhat for reasons discussed below, but still responds to the amplified error signal to provide a symmetrically limited signal current with essentially no accompanying direct component. This signal current is apportioned in equal amounts to the input circuits of phase-splitting amplifiers 20 and 25.

Phase-splitting amplifier 20 is similar to phase-splitting amplifier 25, but the connections of the output circuits of phase-splitting amplifier 20 to the base electrodes of composite transistors 41 and 42 are interchanged as compared to the connections of the output circuits of phase-splitting amplifier 25 to the base electrodes of composite transistors 43 and 44. This is done so the half-bridge amplifier configuration comprising composite transistors 41 and 42 operates in push-pull with the half-bridge amplifier configuration comprising composite transistors 43 and 44. The common-base amplifier 204 is inserted to isolate the collector of transistor 203 from potential variations which otherwise slightly affect its current mirror amplifier relationship with self-biased transistor 201.

Composite transistors 41 and 42 are connected in push-pull for signal and are stacked for serial quiescent collector-to-emitter current flow. Composite transistors 43, 44 are similarly connected with each other. The connections of the phase-splitting amplifier 20 to the base electrodes of transistors 41, 42 is such that output signals at a terminal $T_2$ are of opposite sense of swing to the input signal at terminal $T_1$. The connections of the phase-splitter amplifier 25 to the base electrodes of transistors 43, 44 is such that the output signals at a terminal $T_3$ are of the same sense of swing as the input signal at terminal $T_1$.

The anti-phase output signals at terminals $T_2$ and $T_3$ are differentially combined in a difference amplifier 50 to provide a degenerative feedback signal to the input circuits of the phase-splitter amplifiers 20, 25. Thus, local degenerative feedback is provided around the output amplifier stages 41, 42, 43, 44 and the phase-splitter amplifiers 20, 25. The anti-phase output signals at terminals $T_2$ and $T_3$ are differentially combined in a difference amplifier 60 to obtain a degenerative feedback signal applied to the input amplifier stage 10. This provides overall degenerative feedback around the entire audio amplifier of FIG. 2.

The base electrode of transistor 411, which is the base electrode of the composite transistor 41 is clamped by an assymetrically conductive device 83 (shown as a diode) to the temperature-dependent potential developed across resistor 81 whenever the emitter current of transistor 41 approaches an excessive value. This restricts the application of further base current to the composite transistor 41 and consequently reduces the availability of increased collector current therefrom. The clamping action involves no high-gain negative feedback loop, so the possibility of a high-gain feedback loop displaying regenerative or oscillatory phenomena for certain conditions of clamping is obviated.

Composite transistor 43 is protected against excessive collector currents in similar fashion. Elements 431, 432, 433, 434, 435, 84, 85 associated therewith correspond respectively to elements 411, 412, 413, 414, 415, 82, 83 associated with composite transistor 41.

The interconnection of the diodes 83, 85 might be returned to a source of clamping potential having a low source impedance. This is not done in the circuit shown in FIG. 2, however, since it is desired to control the clamping potential applied to this interconnection. The presence of the resistor 81 causes the clamping action at the base electrodes of transistors 41, 43 to yield to substantially large base currents. Such large currents may be applied to these base electrodes from phase-splitting amplifiers 20, 25, when the local or overall feedback loops are disabled, for example. Provision is accordingly made to limit the peak values of these base currents. This limiting is accomplished in stage 15' by limiting the maximum peak-to-peak excursion of signals supplied to the input circuits of phase-splitting amplifiers 20, 25.

This peak-to-peak limiting of input signal currents to the phase-splitter amplifiers 20, 25 is preferably done with essentially perfect symmetry. This affords substantially equal protection of each of the output devices 41, 42, 43, 44 from application of currents so large as to induce second breakdown. At the same time, the undistorted output signal power available from the output stages is maximized for a given amount of protection against second breakdown in the least well protected one of the devices 41, 42, 43, 44.

During periods of non-limiting, the output signal currents from limiter stage 15' are proportional to its input signal currents provided from the collector electrode of transistor 13. The levels at which signal current peaks are limited are controlled in substantially linear proportion to the potential V(T) appearing at the emitter electrode of a control amplifier transistor 700, as will now be described. The transistor 151 obtains its base-emitter biasing from its own collector electrode, a degenerative feedback connection which regulates its collector-to-emitter potential to be equal to a base-emitter offset potential, $V_{BE}$ (about 650 millivolts for a silicon transistor), plus the potential drop caused by the passage of its base current through resistor 152. This latter potential drop is small (about 50 to 100 millivolts) as compared to $V_{BE}$ because the resistance of resistor 152 is chosen suitably small. The potential across the serial combination of resistors 153 and 154 therefore is to good approximation V(T) - $V_{BE}$. The resistance of this serial combination is chosen according of Ohm's Law so that in the absence of current flow via the collector electrode of transistor 13, the current flow in the serial combination is substantially twice that desired for the quiescent collector current of transistor 13, which is to be operated as a Class A amplifier.

The quiescent potential on the buss 160, to which the collector electrode of transistor 155 is connected, is constrained to be equal to the base-emitter offset potentials of transistors 201, 251, so the potential across the series combination of resistor 156 and diode 157 can also be expressed to good approximation to be V(T) — $V_{BE}$. The resistance of this series combination is chosen such that current flow therethrough is equal to the quiescent collector current of transistor 13.

When transistor 13 has sufficiently positive signal potential applied to its base electrode to cause its collector current to be substantially twice its quiescent level, current flowing through resistor 153 is diverted from transistor 151. The base emitter potentials of transistors 151, 155 become smaller, reducing their collector-to-emitter conduction substantially to zero. The full current flow through resistor 156, equal to the quiescent collector current of transistor 13 flows via buss 160 to the input circuits of phase-splitter amplifiers 20, 25. This establishes the maximum flow of current to the phase-splitter amplifiers 20, 25.

When transistor 13 has the positive signal potential applied to its base electrode reduced sufficiently to reduce its collector-to-emitter conduction substantially to zero, the collector current of transistor 151 is as heretofore noted twice the quiescent collector current of transistor 13. Since the base electrodes of transistors 151, 155 are similarly biased via equal resistance resistors 152, 158 from the collector electrode of transistor 151, their collector current flows will be alike. (The equal-resistance resistors 152, 158 help to ensure this equality while permitting the transistors 151, 155 to be operated in grounded-emitter amplifier configuration.) The collector current of transistor 155 is now twice the quiescent collector current of transistor 13. The current flow through resistor 156 is only equal to the quiescent collector current of transistor 13. The remaining portion of the collector current of transistor 155, which equals the quiescent current flow of transistor 13, must be withdrawn via bus 160 from the input circuits of the phase-splitter amplifiers 20, 25. This establishes maximum flow of current from the phase-splitter amplifiers 20, 25, since once transistor 13 is biased out of conduction by reduction of its base-emitter potential, biasing its base electrode more negatively has no effect on the subsequent circuitry.

Signal potential excursions applied to the base electrode of transistor 13, which are insufficiently large to cause the currents in buss 160 to reach their maximum are linearly amplified in the limiting circuitry 15' to appear as signal currents on the buss 160. (The transistor 13, a grounded-emitter amplifier operated Class A, provides collector current variations which are linearly related to its base-emitter potential variations coupled via resistor 154 as input signal current variations to a current mirror amplifier configuration including transistors 151, 155.)

In FIG. 2, the collector load of the transistor 151 is a tapped resistive load comprising resistors 153, 154. If the collector electrode of transistor 13 is connected directly to that of transistor 151, the collector current variations of transistor 13 operating into the low input impedance offered by diode-connected transistor 151 will not develop appreciably large signal potential variations. Moving the connection of the collector electrode of transistor 13 to a tapped position on the collector load of transistor 151 permits developing potential variations responsive to the variations of the collector current of transistor 13 at terminal $T_9$.

These variations are fed back from terminal $T_9$ to terminal $T_8$ via a series RC network comprising, for example, an 18 kilohm resistor and a 22 pf capacitor and are used to provide phase compensation to stabilize the overall feedback loop. The overall feedback loop including input stage 10, common-collector amplifier transistors 11 and 12, grounded emitter amplifier transistor 13, limiting circuitry 15', phase-splitter amplifiers 20, 25, output transistors 41–44 and difference amplifier 60 is operated so as to tend to establish the presumed value of quiescent collector current for the transistor 13, substantially as described in connection with FIG. 1.

The current levels at which limiting ocurs in limiter circuitry 15' are, as herein before noted, substantially linearly proportional to V(T) — $V_{BE}$. So, by controlling the potential V(T) as applied from the emitter electrode of control amplifier transistor 700, these current levels can be adjusted. Such control is exerted by the control potential supply 70, which also maintains a regulated energizing potential $V_z$ across avalanche diode 701 for application to the input amplifier stage 10 and phase-splitter bias circuitry 30.

A 2$V_{BE}$ potential drop from B+ potential as applied to terminal $T_5$ is maintained between the collector and emitter electrodes of transistor 702 which is in a diode-connected Darlington configuration with transistor 703. This potential drop biases the base-emitter circuit of a composite PNP transistor formed from PNP transistor 704 and NPN transistor 705.

A 1$V_{BE}$ potential is maintained across the resistor 706 establishing the value of the emitter current of the composite transistor and consequently its substantially similar collector current. This collector current is supplied from the emitter electrode of the NPN transistor 705 to bias the diode 701 into avalanche.

The regulated potential $V_z$ appearing across avalanche diode 701 is coupled via resistor 707 to the base electrode of 700. In the absence of current flow other than the base current of transistor 700 through resistor 707, the voltage V(T) at the emitter electrode of transistor 700 is substantially equal to $V_z$ minus the $V_{BE}$ drop across its base-emitter junction. The collector current of transistor 710 increases as the temperature of the integrated circuit increases beyond a certain threshold as explained hereinafter. The collector current of transistor 710 flows through resistor 707, causing a proportional voltage drop thereacross. Consequently, the base potential of transistor 700 is reduced as temperature rises above the threshold. This potential decreased by the $V_{BE}$ drop across the base-emitter junction of transistor 700 appears as V(T) at its emitter electrode. V(T) is reduced with temperature increase above the threshold, and the levels to which the limiter circuitry 15' limits its output signal current excursions are reduced accordingly.

$V_z$ is applied to serially connected resistors 711, 712 which by resistive potential divider action supply a potential substantially invarient with temperature and equal to 0.5 volt to the base-emitter circuit of transistor 710, which includes a resistor 713. Resistor 713 reduces the transconductance ($g_m$) of transistor 713 at increasing current levels, thus preventing the possibility of thermal oscillation in the temperature sensing circuitry. For a fixed level of base-emitter potential, the collector current of transistor 710, as for any transistor, will increase markedly as a function of temperature increase beyond a certain threshold temperature. An increase collector current of transistor 710 causes a proportionally increased potential drop across resistor 707. The base potential of control amplifier transistor 700 and its emitter potential V(T) are accordingly reduced. The limiter circuitry 15' responds to reduce the maximum peak-to-peak excursions of its output signal currents.

Since the overall feedback loop acts to reduce the quiescent collector current of transistor 13 under these conditions, the transconductance of transistor 13 is also reduced. This effect acts to reduce the level of output signal currents from the limiter circuitry 15' as well as to restrict their maximum peak-to-peak excursion, although the effect is counteracted in part by the overall electrical feedback.

The diode 157 becomes non-conductive when V(T) falls below $2V_{BE}$. This prevents current being withdrawn via buss 160 from the base-emitter junctions of transistors 202, 252, to unbalance the bridge amplifier configuration 40 by transistors 13, 151, 171 when the emitter electrode of control transistor amplifier 700 no longer presents a low source impedance. This is necessary to prevent feed-through of collector current variations of transistor 13 to the phase-splitter amplifiers when limiter circuit 15' is supposed to reduce its output signal currents to zero. The use of the diode 157 and of a tapped collector load 153, 154 for transistor 151 introduces a problem of tracking the anti-phase signal currents withdrawn from the emitter electrode of transistor 700 through resistors 153, 156 so they cancel at all levels of V(T). It is desirable that the emitter current of transistor 700 exhibit as little variation due to signal as possible since the collector current of transistor 700, directly related to its emitter current is used to establish a direct potential across resistor 81.

The direct potential developed across resistor 81 accordingly is proportional to $V_T$ by the common-emitter amplifier action of transistor 700. As V(T) is reduced with increasing temperature, the potential drop across resistor 81 is decreased. This causes the clamping action of diodes 83 and 85 upon the base electrodes of composite transistors 41 and 43, respectively, to occur for reduced values of over-current. Thus, as temperature increases, the dissipation permitted in transistors 41, 43 during overload conditions is reduced. During application of squelch or low supply voltage, V(T) equaling zero, the diodes 83 and 85 will prevent application of appreciable base currents to composite transistors 41, 43.

Grounded-emitter amplifier transistor 171 has its base electrode coupled via resistor 172 to the collector electrode of transistor 151. The collector current of transistor 171 is supplied to the emitter electrode of transistor 700 and combines with currents drawn through resistors 153, 156 to cancel signal variations in the emitter current of transistor 700 at all levels of V(T) and at all levels of signal currents from the collector electrode of transistor 13.

V(T) is also controlled as a function of B+ potentials applied to terminal $T_5$, being substantially zero when B+ dips below 7.5 volts. During each condition, current flows through transistors 702, 703 through resistor 721 to the base emitter junction of transistor 722 biasing it into conduction and clamping the base electrode of control amplifier transistor 700 to ground potential. The base-emitter junction of transistor 700 will not be forward biased. There is no forward bias potential for the base emitter junctions of transistors 151, 155. Diode 157 is reverse-biased. The limiter circuit 15' provides no output signal currents to the phase-splitter amplifiers 20, 25. For this condition the biasing of the output stages 41, 42, 43, 44 from phase-splitting amplifiers 20, 25 is regulated by the local feedback loop connection provided by differential amplifier 50.

When B+ potential rises above approximately 7.5 volts, the threshold potential necessary for current flow through the serially connected resistor 723 avalanche diode 724 and the base emitter junction of transistor 725 is exceeded. The forward bias applied to the base emitter junction of transistor 725 clamps the base electrode of transistor 722 to ground. Transistor 722 is thereby rendered non-conductive and no longer acts to cause a potential drop across resistor 707. V(T) is controlled strictly as a function of the collector current of transistor 710, which as heretofore noted varies as a function of temperature.

Terminal $T_4$ permits the base electrode of transistor 725 to be clamped to ground or to a negative potential by means outside the integrated circuit to decouple signal currents from the phase-splitter amplifiers 20, 25 and output amplifier stages 41, 42, 43, 44. This is useful for providing squelch in FM automobile radio receivers, for example.

Figure 3:
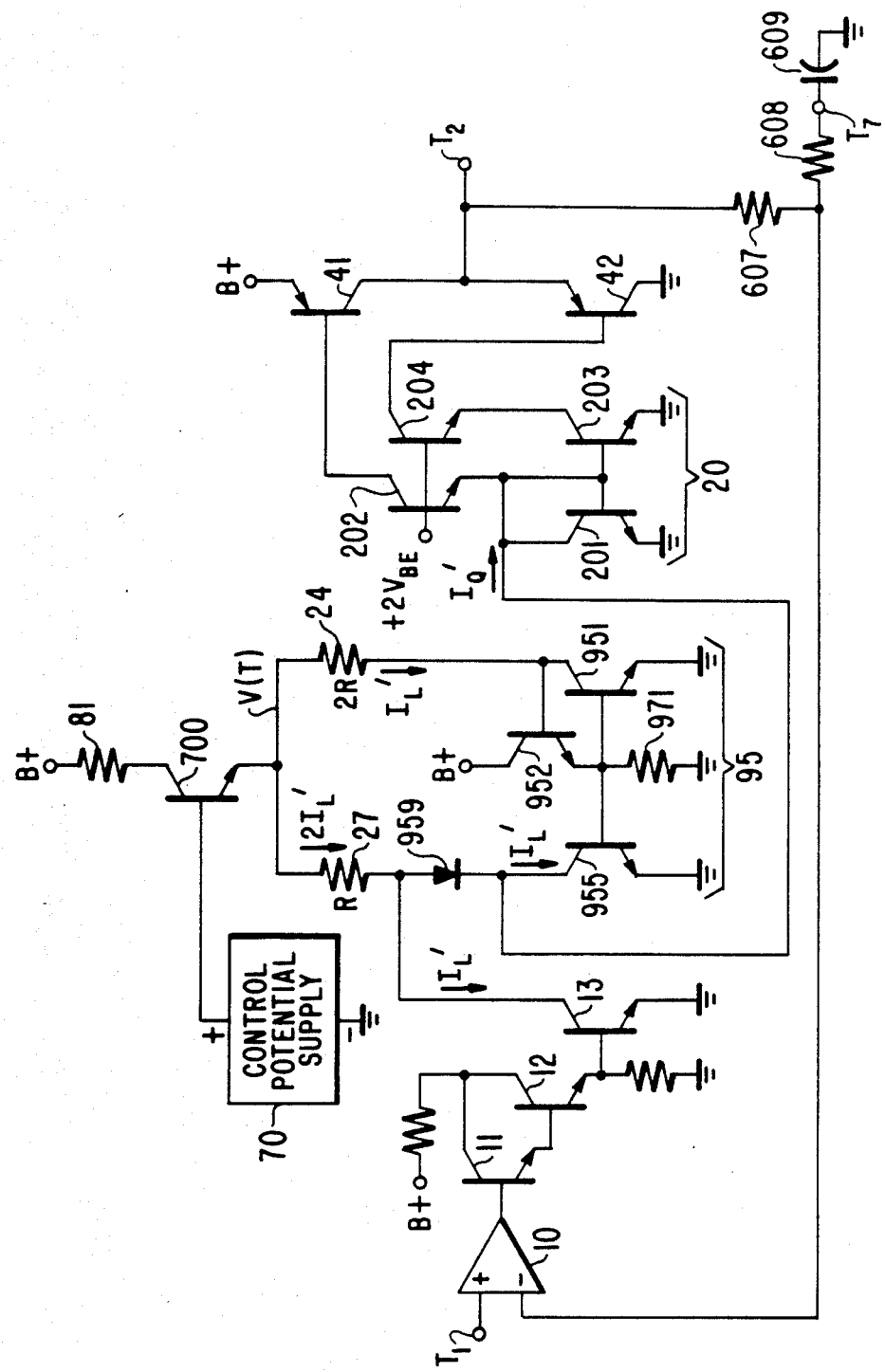
FIG. 3 is a schematic diagram, partially in block form, of an amplifier including another current limiting apparatus, embodying the present invention.

FIG. 3 shows an alternative embodiment of the present invention using limiting circuitry 95 rather than 15. Limiting circuitry 15 does not invert the signal current as coupled from the collector electrode of transistor 13 to the input circuit of phase-splitting amplifier 20 (as contrasted with limiting circuitry 95, which does invert the signal current as coupled from the collector load of transistor 13 to the input circuit of phase-splitting amplifier 25). So, phase-splitter amplifier 20 is connected to the base electrodes of transistors 41 and 42 opposite way to that in which phase-splitting amplifier 25 is connected to the base electrodes of transistors 43 and 44. This is done so the overall feedback remains degenerative.

Elements 201, 202, 203, 41 and 42 otherwise correspond substantially in their function to elements 251, 252, 253, 43 and 44, respectively. Transistor 204 is used to decouple output signal potential swings at terminal T$_2$ from the collector electrode of transistor 203 to hold the current gain of the current mirror amplifier formed by transistors 201 and 203 more constant. In the FIG. 3 amplifier, the overall feedback acts to keep the quiescent current $I_Q'$ into current-splitting amplifier 20 substantially zero-valued.

Transistors 951 and 955 are connected in a current mirror amplifier configuration with transistor 951 being provided collector-to-base feedback by the emitter-follower action of transistor 952. This feedback regulates the emitter-to-collector potential of transistor 951 to a value of $2V_{BE}$. Resistor 24 has a current $I_L'$ flowing therethrough determined according to Ohm's Law to be equal to the $V(T) - 2V_{BE}$ potential drop across resistor 24 divided by the 2R resistance of resistor 24. The potential at the input of current splitting amplifier 20, to which the cathode of diode 959 is connected, is $+1V_{BE}$, and so the anode of diode 959 when forward-biased will be at a $-2V_{BE}$ potential. Resistor 27 therefore has a quiescent potential $V(T) - 2V_{BE}$ thereacross; by making the resistance R of resistor 27 half the resistance 2R of resistor 24 a quiescent current of $2I_L'$ will flow through resistor 27. Half of this $2I_L'$ current will flow through to supply the collector current demand of transistor 955, and the overall feedback loop adjust the circuit so substantially all of the remainder is demanded as quiescent collector current by transistor 13. Diode 929 may consist of a self-biased transistor.

Symmetrical current signal limiting is afforded as follows. Large negative swings of input signal applied to input terminal T$_1$ are amplified by cascaded amplifiers 10, 11, 12 and cut off base current flow to transistor 13. Transistor 13 being a unilaterally operative amplifier accordingly demands no collector current. So, none of the $2I_L'$ current flow in resistor 27 is diverted to transistor 13 as collector current, but instead all of the $2I_L'$ flows through diode 959. Only half the $2I_L'$ current flow is demanded as collector current by transistor 955, and the remainder $I_L'$ current flows as positive input current into phase-splitting amplifier 20.

Large positive swings of input signal current applied to terminal T$_1$, on the other hand, are amplified by cascaded transistors 10, 11 and 12 to increase the base current available to transistor 13. As the collector current demand of transistor 13 reaches $2I_L'$ and tends to exceed diode 959 is no longer forward-biased. Transistor 13 proceeds to saturate; diode 959 is non-conductive and does not permit the increased collector current demand of transistor 13 to be satisfied from the input circuit of phase-splitting amplifier 20. With the collector current demand of transistor 13 exceeding its $I_L'$ quiescent value, a portion less than $I_L'$ of the current flow in resistor 27 is available to flow through diode 959. The collector current demand of transistor 955 accordingly must be met by current flow from the input circuit of phase-splitting amplifier 20. In the limit, where no current flows through diode 959, the complete $I_L'$ collector current demand of transistor 955 is imposed upon the input circuit of phase-splitting amplifier 20. So, the input current to phase-splitting amplifier 20 is symmetrically limited to values of $\pm I_L'$.

Figure 4:
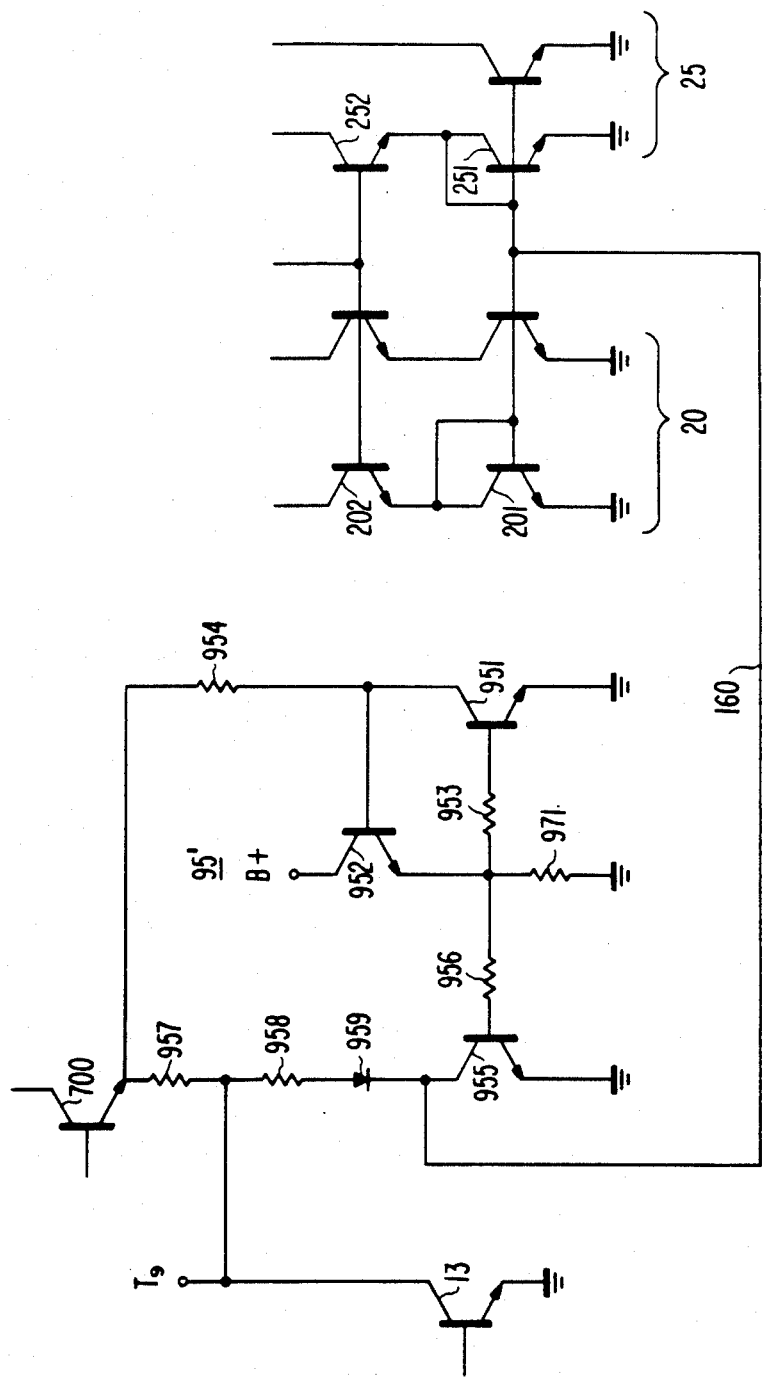
FIG. 4 is a schematic diagram showing the current limiting apparatus of FIG. 3 modified to replace that shown in the FIG. 2 schematic diagram.

FIG. 4 shows current limiting circuitry 95' which is an adaptation of the FIG. 3 current limiting circuitry 95 suited for replacing current limiting circuitry 95' in FIG. 3. The principal differences between current limiting circuitry 95' and 95 are as follows. In current limiting circuitry 95', equal-valued based resistors 953 and 956 are provided to transistors 951 and 955 to improve the likelihood that their collector currents will be well-matched. In current limiting circuitry 95' the collector electrode of transistor 13 is connected to the interconnection of serially-connected resistors 957 and 958 which replace resistor 27. This provides for collector potential swing of transistor 13 responsive to its collector current variations, to be coupled via terminal T$_9$ and an RC series combination to the base electrode of transistor 11 and thus implement local high-frequency a-c feedback.

Referring to FIG. 4, grounded-emitter amplifier transistor 951 is provided with collector-to-base degenerative feedback via common-collector amplifier transistor 952 and resistor 953. This connection regulates the collector-to-emitter potential of transistor 951 to be substantially equal to the sum of the base-emitter offset potentials of transistors 951 and 952 ($2V_{BE}$). The potential drop across resistor 953 is about 50 to 100 millivolts as compared to 650 millivolts, approximately, for $V_{BE}$ and may be neglected in the calculations. A potential difference substantially equal to $V(T) - 2V_{BE}$ is therefore impressed on resistor 954, determining the current therethrough. The resistance of resistor 954 is chosen so that the current therethrough is equal to the quiescent collector current flow of the Class A amplifier transistor 13.

Grounded-emitter amplifier transistor 955 and its base resistor 956 are identical in nature to transistor 951 and its base resistor 953, respectively. Thus the base-emitter circuit bias conditions on transistors 951, 955 are the same, in consequence whereof their collector currents are substantially the same.

The potential at the collector electrode of transistor 955 is clamped at a $1V_{BE}$ potential by diode-connected transistors 201, 251 of phase-splitter amplifiers 20, 25. Presuming no collector current flows from transistor 13, current will flow from the emitter electrode of transistor 700 through serially connected resistors 957, 958 and diode 959. Diode 959 is forward biased in this condition, so its anode is at a $2V_{BE}$ potential, just as is the collector electrode of transistor 951. The same $V(T) - 2V_{BE}$ potential as is impressed across the series combination of resistors 957, 958 as across resister 954. By choosing the resistance of this series combination to be substantially one-half that of resistor 954, the flow of current through elements 957, 958, 959 is twice the quiescent collector current of transistor 13. In the absence of signal current half the flow of current through elements 957, 958, 959 must flow to supply the collector current of transistor 955 and the other half to supply the quiescent collector current of transistor 13.

When transistor 13 is biased out of conduction, this other half is supplied via elements 958, 959 to the buss 160 to flow to the input circuits of the phase-splitter amplifiers 20, 25. This is the maximum current flow in bus 160 in this direction, since as transistor 13 becomes conductive, its collector current demand will reduce the potential at terminal T$_9$ and consequently the current supplied via elements 958, 959.

When the base electrode of transistor 13 has a signal potential applied thereto sufficient to bias the transistor 13 so its collector current approached twice its quiescent value, the potential drop across resistor 957 will be increased so as to reduce current flow in resistor 958 and diode 959. Frther, increase of the collector current substantially past twice its quiescent value reverse-bias diode 959, rendering it non-conductive. The only current flowing through buss 160 is that withdrawn through the collector electrode of transistor 955 from the input circuits of the phase-splitter amplifiers 20, 25. This current, substantially equal to the quiescent collector current of transistor 13 is the maximum current flow via buss 160 in this direction.

For signal potentials applied to transistor 13 which cause its collector current to range between zero and twice its quiescent value, the limiting circuitry 95 responds nearly linearly in supplying currents to buss 160. The collector current variations of transistor 13 are supplied to a load in effect comprising substantially the parallel combination of resistors 957 and 958 developing signal potentials at terminal $T_9$. The current in 958 responds nearly linearly to the potentials at terminals $T_9$ so long as diode 959 is forward-biased, and the portion of this current left after supplying a direct collector current to transistor 955 is supplied to buss 160.

The resistance of resistor 971 is not critical. Optimally, it is chosen that the emitter current of transistor 952 is of a value such that the base-emitter offset potential of transistor 952 and the drop across diode 959 are substantially equal for quiescent collector current in transistor 13.

What is claimed is:

1. Apparatus for providing a symmetrically limited bidirectional signal current, said apparatus comprising:
   means for supplying an a-c signal current superimposed on a first direct current component to form a composite signal current;
   means for providing a proportional response to only those portions of said composite signal current which are of the same polarity as its first direct current component and are smaller in amplitude than twice its first direct current component, otherwise providing substantially no response, thereby to provide a limited unidirectional response current to said composite signal current;
   means for supplying a second direct current component in predetermined ratio to said first direct current component; and
   means for linearly combining said second direct current component with said unidirectional response current in such proportion as to obtain a response with no accompanying quiescent current component, said response being said symmetrically limited bidirectional signal current.

2. Apparatus as forth in claim 1 wherein said means for providing a proportional response to only those portions of said composite signal current which are of the same polarity as its direct component and are smaller in amplitude than twice its direct component includes:
   a first transistor having base and emitter and collector electrodes;
   means connecting said first transistor as a common-emitter amplifier of those portions of said composite signal current applied between its base and emitter electrodes which are of the same polarity as its direct component, said first transistor responding to said direct component of said composite signal current with a quiescent collector current;
   a first direct current source supplying a direct current substantially two times as large as the quiescent collector current of said first transistor; and
   means connecting said first direct current source between said first transistor emitter and collector electrodes so that a portion of the direct current it supplies flows through said first transistor responsive to the common-emitter amplifier action of said first transistor and so that the remainder of the direct current supplied by said first direct current source flows as said limited, unidirectional response current.

3. Apparatus as set forth in claim 2 wherein said means for linearly combining said second direct current component with said unidirectional response current to obtain a response with no accompanying quiescent current component includes:
   a current amplifier having an input connection and an output connection and a common connection, exhibiting a current gain of —G between its input and output connections, and having its input and common connections connected across said first direct current source to receive said limited unidirectional response current; and
   wherein said means for supplying a second direct current component comprises a second direct current source supplying a current G times as large as the quiescent collector current of said transistor connected between the output and common connections of said current amplifier in the correct polarity to obtain said response with no accompanying quiescent current component.

4. Apparatus as set forth in claim 2 wherein said means for supplying a second direct current component comprises
   a second direct current source supplying a direct current substantially equal to the quiescent collector current of said first transistor; and
   wherein said means for linearly combining a second direct current component with said unidirectional response current to obtain a response with no accompanying quiescent current component comprises
   a unilaterally conductive means serially interconnected with said second direct current source across said first direct current source, said unilaterally conductive means poled to conduct said limited unidirectional response current and said second direct current source being poled relative to said first direct current source so said symmetrically limited bidirectional current response is provided at the interconnection between the second direct current source and said unilaterally conductive means.

5. A peak-to-peak current limiter amplifier comprising:
   an input terminal and a common terminal for receiving between them input signal superimposed on a bias level, an intermediate terminal, and an output terminal for supplying a symmetrically limited output signal current;
   means for applying a first current and a second current of opposite polarity and in substantially two to one ratio with each other, said first and said second currents being supplied respectively to said intermediate terminal and to said output terminal and being substantially direct currents;
   a first transistor being of a first conductivity type, having a base and an emitter electrodes connected to separate ones of said input and said common terminals and having a collector electrode connected to said intermediate terminal, said transistor responsive to said bias level when said input signal is zero-valued to divert one half of said first current onto itelf as collector current; and first unilaterally conductive means connected between said intermediate terminal and said output terminal, and poled for conducting that portion of said first current not appropriated as collector current by said first transistor.

6. A peak-to-peak current limiter amplifier as set forth in claim 5 connected in combination as follows to provide a power amplifier for driving a load;

a phase-splitter amplifier having an input circuit connected between said output and said common terminals of said limiter amplifier, having a first output circuit with substantially Class B response to positive swings of current supplied to its input circuit and having a second output circuit with substantially Class B response to negative swings of current supplied to its input circuit;

first and second terminals between which an operating potential is applied;

means connected to said limiter amplifier common terminal and to at least one of said first and second terminals for referring the potential at said common terminal to said operating potential;

second and third transistors having respective emitter-to-collector paths connected at one end respectively to said first terminal and to said second terminal and connected at the other end to an interconnection for coupling to said load, said second and third transistors also having respective base electrodes one connected to the first output circuit of said phase-splitter amplifier and the other to the second output circuit of said phase-splitter amplifier.

7. A combination as set forth in claim 6 wherein said phase-splitter amplifier includes:

fourth and fifth transistors of said first conductivity type, each having base and emitter electrodes with a base-emitter junction therebetween and each having a collector electrode, the collector electrode of one of the fourth and fifth transistors direct coupled to said second transistor base electrode and the other to said third transistor base electrode, said fourth transistor emitter electrode and said fifth transistor base electrode being connected together for connection to said limiter amplifier output terminal, said fifth transistor emitter electrode being connected to said limiter amplifier common terminal; and means connected between said fourth transistor base electrode and said fifth transistor emitter electrode for supplying forward bias to the base-emitter junctions of said fourth and fifth transistors;

and wherein said peak-to-peak limiter includes:

sixth and seventh transistors of said first conductivity type, each having an emitter electrode connected to said limiter amplifier common terminal, each having a collector electrode, each having a base electrode direct coupled to the collector electrode of said sixth transistor, said sixth transistor being thereby provided with degenerative collector-to-base feedback, said seventh transistor collector electrode being connected to said limiter amplifier output terminal;

a control terminal for receiving a control potential;

a first resistive element connected between said control terminal and said intermediate terminal; and a second resistive element connected between said control terminal and said sixth transistor collector electrode.

8. A peak-to-peak current limiter amplifier as set forth in claim 5 arranged in combination with other elements to provide a power amplifier for driving a load, said combination having:

first and second terminals between which an operating potential is applied, said first terminal having said limiter amplifier common terminal connected thereto;

a second transistor of second conductivity type complementary to said first conductivity type, said second transistor having emitter and collector electrodes with an emitter-to-collector path therebetween and having a base electrode;

a first resistive element connected between said second transistor emitter electrode and said second terminal to sense the current flow through the collector-to-emitter path of said second transistor;

a third terminal for connection to a load, said second transistor collector electrode being connected to said third terminal;

a third transistor having a base electrode and having a collector-to-emitter path connected between said second and said third terminals;

a phase-splitter amplifier having an input circuit connected between said output and said common terminals of said limiter amplifier, having a first output circuit with substantially Class B response to positive swings of current supplied to its input circuit and having a second output circuit with substantially Class B response to negative swings of current supplied to its input circuits, said phase-splitter amplifier comprising:

fourth and fifth transistors, each included in said phase-splitter amplifier, each being of said first conductivity type, each having base and emitter electrodes with a base-emitter junction therebetween and having a collector electrode, their base-emitter junctions being serially connected to receive a forward biasing potential, said fourth transistor emitter electrode and said fifth transistor base electrode being joined together and connected to said limiter amplifier output electrode, said fifth transistor emitter electrode being connected to said limiter amplifier common terminal, one of the collector electrodes of said fourth and said fifth transistors being direct coupled to said second transistor base electrode and the other being direct coupled to said third transistor base electrode;

sixth and seventh transistors of said first conductivity type, included in said limiter amplifier, each having an emitter electrode connected to said limiter amplifier common terminal, each haing a collector electrode, each having a base electrode direct coupled to the collector electrode of said sixth transistor, said seventh transistor collector electrode being connected to said limiter output terminal;

an eighth transistor of said first conductivity type, having an emitter electrode connected to said control terminal and having base and collector electrodes;

a second resistive element included in said limiter amplifier and connected between the control and intermediate terminals of said limiter amplifier;

a third resistive element included in said limiter amplifier and connected between said limiter amplifier intermediate terminal and said sixth transistor collector electrode;

a fourth resistive element having first and second ends respectively connected to said eighth transistor collector electrode and to said second terminal, for responding to the collector current of said eighth transistor to provide a potential at its first end;

second unilaterally conductive means connected between said second transistor base electrode and the first end of said fourth resistive element and poled to permit simultaneous easy conduction with base current flow to said second transistor; and means responsive to said operating potential for supplying a control potential between said eighth transistor base electrode and said first terminal, which means responds to increasing temperature of said second transistor to reduce the control potential it supplies.

9. A limiter amplifier for supplying a current to an output circuit, which current is symmetrically limited on its relatively positive and relatively negative peaks, said limiter amplifier comprising:

a common terminal for connection to a reference potential;

an input terminal for connection to a signal current source;

a control terminal for application of a control potential;

an output terminal between which and said common terminal the output circuit of said limiter amplifier is connected;

first and second galvanically conductive current paths, at least the first of which first and second current paths is a resistive path, the first and second ends of said first current path being respectively connected to said control terminal and to said input terminal, the first end of said second current path being connected to said input terminal;

a current mirror amplifier having its input terminal connected to the second end of said second current path, having its common terminal connected to said common terminal of said limiter amplifier and having its output terminal connected to said output terminal of said limiter amplifier;

a third galvanically conductive current path having first and second ends respectively connected to said control terminal and to said output terminal, said third current path including a resistance and unidirectionally conductive means in series connection between its first and second ends, the unidirectionally conductive means poled for conducting the guiescent output current of said current mirror amplifier.

10. A limiter amplifier as set forth in claim 9 connected in combination as follows to provide a power amplifier for driving a load;

a phase-splitter amplifier having an input circuit connected between said output and said common terminals of said limiter amplifier, having a first output circuit with substantially Class B response to positive swings of current supplied to its input circuit and having a second output circuit with substantially Class B response to negative swings of current supplied to its input circuit;

first and second terminals for receiving an operating potential;

means connected to said limiter amplifier common terminal and to at least one of said first and second terminals for referring the potential at said common terminal to said operating potential;

first and second transistors having respective emitter-to-collector paths connected at one end respectively to said first terminal and to said second terminal and connected at the other end to an interconnection for coupling to said load, said first and second transistors also having respective base electrodes, one of which is connected to the first output circuit of said phase-splitter amplifier and the other of which is connected to the second output circuits of said phase-splitter amplifier.

11. A combination as set forth in claim 10 wherein said phase-splitter amplifier includes:

third and fourth transistors of a first conductivity type, each having base and emitter electrodes with a base-emitter junction therebetween and each having a collector electrode, one of the collector electrodes of the third and fourth transistors direct coupled to said first transistor base electrode and the other direct coupled to said second transistor base electrode, said third transistor emitter electrode and said fourth transistor base electrode being connected together for connection to said limiter amplifier output terminal, said fourth transistor emitter electrode being connected to said limiter amplifier common terminal; and means connected between said third transistor base electrode and said fourth transistor emitter electrode for supplying forward bias to the base-emitter junctions of said third and fourth|transistors.

12. A peak-to-peak current limiter amplifier as set forth in claim 9 arranged in combination with other elements to provide a power amplifier for driving a load, said combination having:

first and second terminals between which an operating potential is applied, said first terminal having said limiter common terminal connected thereto;

a first transistor of a first conductivity type, said first transistor having emitter and collector electrodes with an emitter-to-collector path therebetween and having a base electrode;

a first resistive element connected between said first transistor emitter electrode and said second terminal to sense the current through the collector-to-emitter path of said first transistor;

a third terminal for connection to a load, said first transistor collector electrode being connected to said third terminal;

a second transistor having a base electrode and having a collector-to-emitter path connected between said first and said third terminals;

a phase-splitter amplifier having an input circuit connected between said output and said common terminals of said limiter amplifier, having a first output circuit with substantially Class B response to positive swings of current supplied to its input circuit and having a second output circuit with substantantially Class B response to negative swings of current supplied to its input circuit, said phase-splitter amplifier comprising:

third and fourth transistors, each included in said phase-splitter amplifier, each being of a second conductivity type complementary to said first conductivity type, each having base and emitter electrodes with a base-emitter junction therebetween and having a collector electrode, their base-emitter junctions being serially connected to receive a forward biasing potential, said third transistor emitter electrode and said fourth transistor base electrode being joined together and connected to said limiter amplifier output electrode, said fourth transistor emitter electrode being connected to said first terminal, one of the collector electrodes of said third and said fourth transistors being direct coupled to said first transistor base electrode and the other being direct coupled to said second transistor base electrode;

a fifth transistor of said second conductivity type, having an emitter electrode connected to said limiter amplifier control terminal and having base and collector electrodes;

a second resistive element having first and second ends respectively connected to said fifth transistor collector electrode and to said second terminal, for responding to the collector current of said fifth transistor to provide a potential at its first end;

second unilaterally conductive means connected between said first transistor base electrode and the first end of said second resistive element and poled to permit simultaneous easy conduction with base current flow to said first transistor; and means responsive to said operating potential for supplying a control potential between said fifth transistor base electrode and said first terminal, which means responds to increasing temperature of said first transistor to reduce the control potential it supplies.

* * * * *

UNITED STATES PATENT OFFICE
CERTIFICATE OF CORRECTION

Patent No. 4,004,242          Dated January 18, 1977

Inventor(s) Carl Franklin Wheatley, Jr.

It is certified that error appears in the above-identified patent and that said Letters Patent are hereby corrected as shown below:

Column 1, lines 15-16, "configuration" should read
-- configurations --.

Column 7, lines 27-28, delete "times the beta of one of its output NPN transistors".
Column 7, line 54, "base" should be in quotation marks.
Column 7, line 57, "base" should be in quotation marks.
Column 8, line 1, "collector" and "emitter" should each be in quotation marks.
Column 8, line 4, "base" should be in quotation marks.
Column 8, line 7, "base" should be in quotation marks.
Column 8, line 24, "base" should be in quotation marks.
Column 8, lines 27-28, "emitter" should be in quotation marks.
Column 8, line 29, "base" should be in quotation marks.
Column 8, line 31, "collector" should be in quotation marks.
Column 8, line 38, "collector" should be in quotation marks.
Column 8, line 48, "base" should be in quotation marks.
Column 8, line 49, "base" should be in quotation marks.
Column 8, line 50, "base" should be in quotation marks.
Column 8, line 53, "base" should be in quotation marks.
Column 11, line 68, "base" should be in quotation marks.
Column 12, line 7, "base" should be in quotation marks.
Column 13, line 21, change "$-2V_{BE}$" to -- $+2V_{BE}$ --.
Column 13, line 67, "95' " should read -- 95 --.

UNITED STATES PATENT OFFICE
CERTIFICATE OF CORRECTION

Patent No. 4,004,242            Dated January 18, 1977

Inventor(s) Carl Franklin Wheatley, Jr.

It is certified that error appears in the above-identified patent and that said Letters Patent are hereby corrected as shown below:

Column 14, line 2, "based" should read -- base --.
Column 14, line 68, "Frther" should read -- Further --.
Column 17, line 4, "itelf" should read -- itself --.
Column 18, line 60, "haing" should read -- having --.
Column 18, line 64, after "limiter" insert -- amplifier --.
Column 19, line 59, "guiescent" should read -- quiescent --.

Signed and Sealed this

Seventh Day of June 1977

[SEAL]

Attest:

RUTH C. MASON
Attesting Officer

C. MARSHALL DANN
Commissioner of Patents and Trademarks